(12) United States Patent
Iwashima et al.

(10) Patent No.: US 7,078,158 B2
(45) Date of Patent: Jul. 18, 2006

(54) COMPOSITION FOR ACTIVATION ENERGY RAYS AND METHOD OF FORMING PATTERN

(75) Inventors: Chiaki Iwashima, Kanagawa (JP); Genji Imai, Kanagawa (JP); Takeya Hasegawa, Kanagawa (JP)

(73) Assignee: Kansai Paint Co., Ltd., Amagasaki (JP)

( * ) Notice: Subject to any disclaimer, the term of this patent is extended or adjusted under 35 U.S.C. 154(b) by 56 days.

(21) Appl. No.: 10/488,469

(22) PCT Filed: Sep. 10, 2002

(86) PCT No.: PCT/JP02/09185

§ 371 (c)(1),
(2), (4) Date: Mar. 4, 2004

(87) PCT Pub. No.: WO03/025674

PCT Pub. Date: Mar. 27, 2003

(65) Prior Publication Data

US 2004/0248037 A1    Dec. 9, 2004

(30) Foreign Application Priority Data

Sep. 11, 2001  (JP)  ............................. 2001-275244
Sep. 11, 2001  (JP)  ............................. 2001-275245

(51) Int. Cl.
  *G03C 1/73*   (2006.01)
  *G03F 7/038*  (2006.01)

(52) U.S. Cl. .............................. 430/281.1; 430/270.1; 430/905

(58) Field of Classification Search ............. 430/270.1, 430/281.1, 905, 914, 325, 326, 330
See application file for complete search history.

(56) References Cited

U.S. PATENT DOCUMENTS

| 5,496,678 A |   | 3/1996  | Imai et al. |
|-------------|---|---------|-------------|
| 5,650,259 A | * | 7/1997  | Imai et al. ................ 430/258 |
| 5,876,900 A |   | 3/1999  | Watanabe et al. |

FOREIGN PATENT DOCUMENTS

| JP | 6-230574 A  |   | 8/1994  |
| JP | 6-308733 A  |   | 11/1994 |
| JP | 10-279513   | * | 10/1998 |
| JP | 2000-267285 A |  | 9/2000  |

OTHER PUBLICATIONS

Machine-assisted English translation of JP 10-279513, provided by JPO.*

* cited by examiner

*Primary Examiner*—Sin Lee
(74) *Attorney, Agent, or Firm*—Buchanan Ingersoll PC

(57) ABSTRACT

A composition for activation energy rays comprising a specific vinyl ether group-containing compound (A) in which a vinyl ether group is bonded to a secondary or tertiary carbon atom, a polymer (B) having a carboxyl group and/or a hydroxyphenyl group, and a photo-acid generator compound (C) can form a resist pattern having an excellent sensitivity without carrying out any heat treatment at a temperature of 60° C. or more after irradiation.

1 Claim, No Drawings

COMPOSITION FOR ACTIVATION ENERGY RAYS AND METHOD OF FORMING PATTERN

TECHNICAL FIELD

The present invention relates to a composition for activation energy rays and a method of forming a pattern by the use of the composition, and more particularly, it relates to a method of forming a positive pattern useful for circuit formation of electronic devices, materials for printing, and the like.

BACKGROUND ART

Currently, positive photoresists are widely used for formation of circuit patterns of electronic devices or the like. As positive photoresist compositions which can be used for these applications, combinations of alkali-soluble novolac resins and quinone diazide compounds as sensitizers have often been used.

In this kind of composition, there is utilized a reaction in which a quinone diazide group is photolyzed by irradiation with ultraviolet rays to form indenecarboxylic acid via ketene. However, in the resist formed by using the quinone diazide compound, a resolution is insufficient sometimes in a case where it is necessary to form a very fine pattern.

On the other hand, Japanese Patent Application Laid-open No. 295064/1994 discloses a photosensitive composition comprising a carboxyl group-containing polymer, a compound containing two or more vinyl ether groups in one molecule, and a compound which generates an acid when irradiated with activation energy rays. When a film formed from this composition is heated (primary heating), a polycarboxylic acid resin is cross-linked by an addition reaction between a carboxyl group and a vinyl ether group, so that the film becomes insoluble in a solvent or an aqueous alkaline solution. Furthermore, when the film is further heated (secondary heating) after the irradiation with the activation energy rays, the cross-linked structure is cleaved owing to a catalytic action of the acid generated by the activation energy rays irradiation, so that the irradiated portion becomes soluble in the solvent or the aqueous alkaline solution again. Then, the irradiated portion is removed by development to form a resist pattern.

The above-described method, in which the circuit pattern is formed by heating the photosensitive composition comprising the polycarboxylic acid resin, the polyfunctional vinyl ether compound and the compound which generates the acid when irradiated with the activation energy rays, can basically satisfy a request for the formation of the very fine circuit pattern in recent years. However, in order to cleave the cross-linked structure of the irradiated portion after the activation energy rays irradiation, the heating process is essential, and it is required that the heating process is carried out at 60 to 150° C. for 10 to 60 minutes. The addition of such a heating process (secondary heating) decreases a production speed in a pattern formation process and further may cause another problem such as deformation of a substrate owing to the heating at high temperature. Furthermore, since the acid component generated by the light irradiation diffuses in the resist film owing to the secondary heating, there is also another problem that the resist film having the excellent resolution cannot be obtained.

DISCLOSURE OF THE INVENTION

Therefore, it is an object of the present invention to provide a composition for activation energy rays capable of forming a stable positive resist pattern having an excellent sensitivity and resolution without requiring any heating step under high temperature conditions after irradiation with activation energy rays, as well as a method of forming a pattern by the use of the composition.

The present inventors have made extensive investigation to achieve the object, and as a result, they have found that a stable positive resist pattern having an excellent sensitivity and resolution can be formed without requiring a secondary heat treatment at a high temperature such as 60° C. or higher after irradiation with activation energy rays by the use of a composition for activation energy rays containing, as essential components, a specific vinyl ether group-containing compound, and a polymer having a specific amount of a carboxyl group and/or a hydroxyphenyl group and a specific number-average molecular weight and glass transition temperature, and in consequence, the present invention has been completed.

That is, the present invention is directed to the following aspects:

(1) A composition for activation energy rays, comprising, as essential components, at least one vinyl ether group-containing compound (A) selected from the group consisting of a monovinyl ether compound represented by the following formula (1):

(wherein R is a hydrocarbon bond, a carbon ring structure, a combination bond of a carbon ring structure and a hydrocarbon bond, an aromatic heterocyclic structure, or a combination bond of an aromatic heterocyclic structure and a hydrocarbon bond in which an initial atom of R bonded to an ether bond is a secondary or tertiary carbon atom), and a polyvinyl ether compound represented by the following formula (2):

[wherein $R^1$ is a carbon ring structure, a combination bond of a carbon ring structure and a hydrocarbon bond, an aromatic ring structure, an aromatic heterocyclic structure, a combination bond of an aromatic ring structure and a hydrocarbon bond, a combination bond of an aromatic heterocyclic structure and a hydrocarbon bond, or a hydrocarbon bond having 1 to 24 carbon atoms; $A^1$ and $A^2$ are each a group represented by the following formula (a):

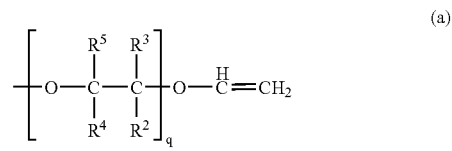

(wherein $R^2$ is independently a monovalent hydrocarbon group with 1 to 24 carbon atoms which may have a carbon ring structure, an aromatic ring structure or a heterocyclic structure, and at least an element at a substitution site of $R^2$ is a carbon atom; $R^3$, $R^4$ and $R^5$ are each independently a monovalent hydrocarbon group with 1 to 24 carbon atoms which may have a carbon ring structure, an aromatic ring structure or a heterocyclic structure, or a hydrogen atom; and q is 0 or 1, provided that when $R^1$ is a hydrocarbon bond having 1 to 24 carbon atoms, both of q's in $A^1$ and $A^2$ are 1, and when q is 0, an atom of $R^1$ bonded to $A^1$ or $A^2$ is a secondary or tertiary carbon atom); and $A^3$ is a group represented by the following formula (b):

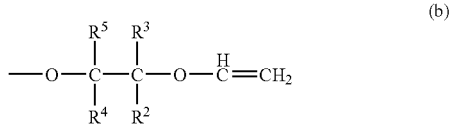

(wherein $R^2$ to $R^5$ are the same as $R^2$ to $R^5$ defined in the formula (a)); and p is an integer of 0 to 2]; and at least one polymer (B) selected from the group consisting of the following polymers (a) to (c);

(a) a polymer containing 0.5 to 10 equivalents of a carboxyl group per kg of the polymer, and having a number-average molecular weight in a range of 3,000 to 100,000 and a glass transition temperature of 0° C. or higher, (b) a polymer containing at least 1 to 10 equivalents of a hydroxyphenyl group per kg of the polymer, and having a number-average molecular weight in a range of 500 to 100,000 and a glass transition temperature of 0° C. or higher, and (c) a polymer containing at least 0.2 to 20 equivalents of a hydroxyphenyl group and a carboxyl group per kg of polymer, and having a number-average molecular weight in a range of 500 to 100,000 and a glass transition temperature of 0° C. or higher.

(2) The composition for activation energy rays according to the paragraph (1), wherein the vinyl ether group-containing compound (A) is cyclohexyl vinyl ether.

(3) The composition for activation energy rays according to the paragraph (1), wherein the vinyl ether group-containing compound (A) is a polyvinyl ether compound represented by the following formula:

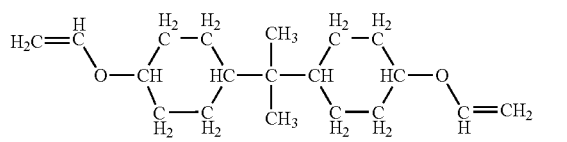

(4) The composition for activation energy rays according to the paragraph (1), wherein the vinyl ether group-containing compound (A) is a polyvinyl ether compound represented by the following formula:

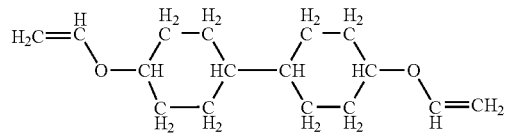

(5) The composition for activation energy rays according to any one of the paragraphs (1) to (4), further comprising a photo-acid generator compound (C).

(6) The composition for activation energy rays according to the paragraph (5), which contains 5 to 150 parts by weight of the vinyl ether group-containing compound (A) with respect to 100 parts by weight of the polymer (B), and 0 to 40 parts by weight of the photo-acid generator compound (C) with respect to 100 parts by weight of the total amount of the polymer (B) and the vinyl ether group-containing compound (A).

(7) A method of forming a pattern, comprising:

a step of applying the composition for activation energy rays onto a substrate;

a step of heating the substrate;

a step of irradiating the substrate with activation energy rays for patterning;

a step of carrying out no heat treatment or carrying out a heat treatment at a temperature less than 60° C. after the irradiation; and a step of developing the substrate with a basic developer.

(8) A method of forming a pattern, comprising:

a step of applying the composition for activation energy rays onto a transparent support film capable of transmitting activation energy rays, and drying it to form a film layer of the composition for activation energy rays as a dry film resist for activation energy rays;

a step of press-bonding the film layer of the composition for activation energy rays as the dry film resist onto a substrate on which a pattern is to be formed;

a step of heating the substrate;

a step of irradiating the film layer with activation energy rays through the support film for patterning;

a step of carrying out no heat treatment or carrying out a heat treatment at a temperature less than 60° C. after irradiation; and a step of removing the support film and developing the substrate with a basic developer.

(9) A method of forming a pattern, comprising:

a step of applying the composition for activation energy rays onto a transfer film, and drying it to form a film layer of the composition for activation energy rays as a transfer film resist;

a step of press-bonding the film layer of the composition for activation energy rays as the transfer film resist onto a substrate on which a pattern is to be formed;

a step of heating the substrate;

a step of removing the transfer film;

a step of irradiating the film layer with activation energy rays for patterning;

a step of carrying out no heat treatment or carrying out a heat treatment at a temperature less than 60° C. after irradiation; and a step of developing the substrate with a basic developer.

BEST MODE FOR CARRYING OUT THE INVENTION

Hereinafter, the present invention will be described in more detail.

First, a composition of the present invention will be descried.

Vinyl Ether Group-Containing Compound (A):

A vinyl ether group-containing compound (A) which is an essential component of a composition of the present invention is a compound in which a vinyl ether group is bonded to a secondary or tertiary carbon. In particular, the vinyl ether group-containing compound is preferably either a monovinyl ether compound represented by the following formula (1):

(1)

(wherein R is a hydrocarbon bond, a carbon ring structure, a combination bond of a carbon ring structure and a hydrocarbon bond, an aromatic heterocyclic structure, or a combination bond of an aromatic heterocyclic structure and a hydrocarbon bond in which an initial atom of R bonded to the ether bond is a secondary or tertiary carbon atom), or a polyvinyl ether compound represented by the following formula (2):

(2)

[wherein $R^1$ is a carbon ring structure, a combination bond of a carbon ring structure and a hydrocarbon bond, an aromatic ring structure, an aromatic heterocyclic structure, a combination bond of an aromatic ring structure and a hydrocarbon bond, a combination bond of an aromatic heterocyclic structure and a hydrocarbon bond, or a hydrocarbon bond having 1 to 24 carbon atoms; $A^1$ and $A^2$ are each a group represented by the following formula (a):

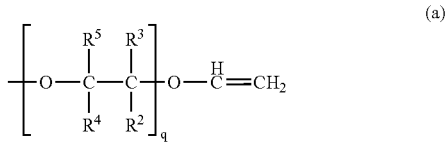
(a)

(wherein $R^2$ is independently a monovalent hydrocarbon group with 1 to 24 carbon atoms which may have a carbon ring structure, an aromatic ring structure, or a heterocyclic structure, and at least an element at a substitution site is a carbon atom; $R^3$, $R^4$ and $R^5$ are each independently a monovalent hydrocarbon group with 1 to 24 carbon atoms which may have a carbon ring structure, an aromatic ring structure or a heterocyclic structure, or a hydrogen atom; and q is 0 or 1, provided that when $R^1$ is a hydrocarbon bond having 1 to 24 carbon atoms, q in each of $A^1$ and $A^2$ is 1, and when q is 0, an atom of $R^1$ bonded to $A^1$ or $A^2$ is a secondary or tertiary carbon atom); $A^3$ is a group represented by the following formula (b):

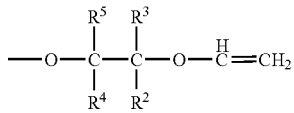
(b)

(wherein $R^2$ to $R^5$ are the same as $R^2$ to $R^5$ defined in the formula (a)); and p is an integer of 0 to 2].

In the formula (1), examples of a hydrocarbon group represented by R include groups each having a secondary or tertiary carbon atom, such as an isopropyl group, a 1-methylpropyl group, a 1-methylbutyl group, a 1-methylpentyl group, a 1-methylhexyl group, a 1-methylheptyl group, a 1-methyloctyl group, a 1-methyldecanyl group, a 1-methyldodecanyl group, a 1-ethylpropyl group, a 1-ethylbutyl group, a 1-ethylpentyl group, a 1-ethylhexyl group, a 1-ethylheptyl group, a 1-ethyloctyl group, a 1-ethyldecanyl group, a 1-ethyldodecanyl group, a t-butyl group, a 1,1-dimethylpropyl group, a 1,1-dimethylbutyl group, a 1,1-dimethylpentyl group, a 1,1-dimethylhexyl group, a 1,1-dimethylheptyl group, a 1,1-dimethyloctyl group, a 1,1-dimethyldecanyl group, and a 1,1-dimethyldodecanyl group.

Examples of a carbon ring structure include a cyclopropyl group, a cyclobutyl group, a cyclopentyl group, a cyclohexyl group, and a cyclooctyl group.

Examples of an aromatic heterocyclic structure include pyrans, pyrones, pyrroles, pyrrolines, pyrrolidines, imidazolines, imidazolidines, pyrazolidines, piperidines, piperazines, morpholines, indolines, and chromans.

A combination bond of the carbon ring structure and the hydrocarbon group, or a combination bond of the aromatic heterocyclic structure and the hydrocarbon group may also be employed, wherein an atom at the bonding site of the vinyl ether group should be a secondary or tertiary carbon atom.

Among them, the carbon ring structure is preferable, and a cyclohexyl group is particularly preferable.

In the formula (2), examples of a monovalent hydrocarbon group having 1 to 24 carbon atoms represented by $R^2$, $R^3$, $R^4$ or $R^5$ include a methyl group, an ethyl group, a propyl group, a butyl group, a pentyl group, a heptyl group, an octyl group, a decanyl group, and a dodecanyl group. These groups may be straight or branched. Examples of a carbon ring structure include a cyclohexyl group and a phenyl group. Examples of a heterocyclic structure include pyrans, pyrones, pyrroles, pyrrolines, pyrrolidines, imidazolines, imidazolidines, pyrazolidines, piperidines, piperazines, morpholines, indolines, and chromans.

Further, in the formula (2), examples of a carbon ring structure represented by $R^1$ include a cyclohexyl group and a phenyl group. Examples of a combination bond of a carbon ring structure and a hydrocarbon bond include a bisphenol residue. Examples of a heterocyclic structure include pyrans, pyrones, pyrroles, pyrrolines, pyrrolidines, imidazolines, imidazolidines, pyrazolidines, piperidines, piperazines, morpholines, indolines, and chromans.

When $R^1$ is a hydrocarbon bond having 1 to 24 carbon atoms, q in each of $A^1$ and $A^2$ is 1, and when q is 0, an atom of $R^1$ bonded to $A^1$ or $A^2$ is a secondary or tertiary carbon atom.

Examples of the compound represented by the formula (2) include the following compounds:

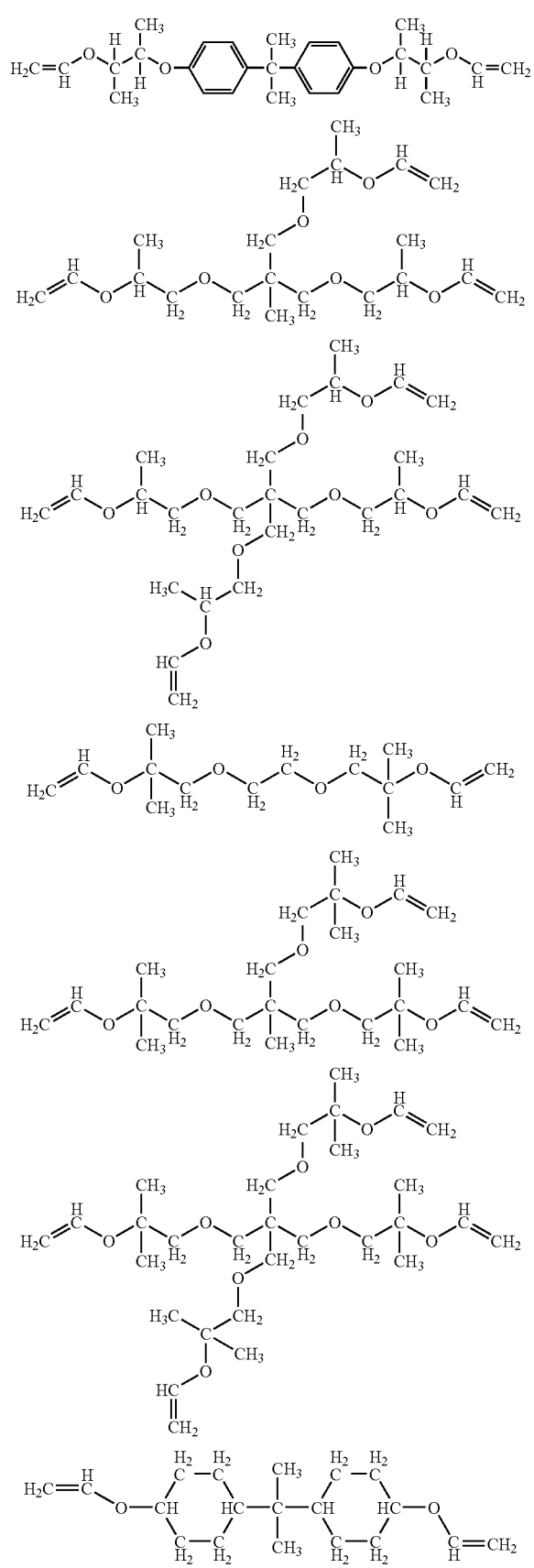

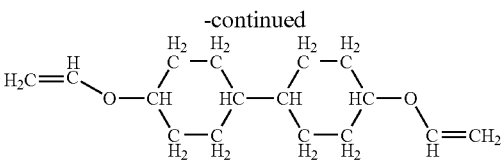

Polymer (B):

Carboxyl Group-Containing Polymer (a):

A carboxyl group-containing polymer (a) is a film-formable polymer containing at least one carboxyl group in one molecule. Examples of such a polymer include: a homopolymer of a carboxyl group-containing polymerizable unsaturated monomer; a copolymer of the carboxyl group-containing monomer and another copolymerizable monomer; a resin of polyester type, polyurethane type, or polyamide type having a carboxyl group in the molecular chain or at the molecular end.

Examples of the carboxyl group-containing polymerizable unsaturated monomer include acrylic acid, methacrylic acid, crotonic acid, and itaconic acid. Examples of another monomer copolymerizable with such a carboxyl group-containing monomer include: $C_1$ to $C_{12}$ alkyl esters of (meth)acrylic acid, such as methyl (meth)acrylate, ethyl (meth)acrylate, propyl (meth)acrylate, butyl (meth)acrylate, hexyl (meth)acrylate, octyl (meth)acrylate, 2-ethylhexyl (meth)acrylate, nonyl (meth)acrylate, and decyl (meth)acrylate; $C_2$ to $C_6$ hydroxyalkyl esters of (meth)acrylic acid, such as hydroxyethyl (meth)acrylate, 2-hydroxypropyl (meth)acrylate, 3-hydroxypropyl (meth)acrylate, and hydroxybutyl (meth)acrylate; vinyl aromatic compounds such as styrene, α-methylstyrene, and p-tert-butylstyrene; vinyl acetate; (meth)acrylonitrile; (meth)acrylamide; and vinylpyrrolidone. These monomers can be used singly or in combination of two or more. In particular, vinyl aromatic compounds such as styrene, α-methylstyrene, and $C_1$ to $C_6$ alkyl substituted styrene (e.g., p-tert-butylstyrene) are preferably used as another monomer in terms of the precision of formed image patterns or resistance to etching.

The polymer (a) preferably has a number-average molecular weight in a range of about 3,000 to 100,000, particularly about 5,000 to 30,000. A preferred range of the carboxyl group content of the polymer (a) is usually 0.5 to 10 equivalents, particularly 0.5 to 5.0 equivalents per kg of polymer. If the carboxyl group content is less that 0.5 equivalent/kg, the cross-linking degree of a film formed by heating before irradiation with activation rays tends to become insufficient, and developability tends to lower due to decreased solubility of the exposed portions in an alkaline developer. On the other hand, if the carboxyl group content exceeds 10 equivalents/kg, the storage stability of the composition tends to lower.

Further, the polymer (a) preferably has a glass transition temperature (Tg) of 0° C. or higher, particularly in a range of 5 to 70° C. If the Tg is less than 0° C., an obtained coating film has adhesiveness and therefore dust and dirt easily adhere to the film so that the handling of the film tends to be difficult.

Hydroxyphenyl Group-Containing Polymer (b):

A polymer (b) is a polymer containing at least one hydroxyphenyl group in one molecule. Examples of such a polymer (b) include: a condensation product of a monofunctional or polyfunctional phenol compound, an alkylphenol compound, or their mixture, with a carbonyl compound such as formaldehyde or acetone; a homopolymer of a hydroxyl group-containing vinyl aromatic compound such as p-hydroxystyrene; and a copolymer of the hydroxyl group-containing vinyl aromatic compound and another copolymerizable monomer.

Examples of the monofunctional or polyfunctional phenol compound include compounds each having 1 to 3 hydroxyl groups on the benzene ring, such as phenol, o-cresol, m-cresol, p-cresol, 3,5-xylenol, 2,6-xylenol, 2,4-xylenol, catechol, resorcin, pyrogallol, and bisphenol A. Examples of the alkylphenol compound include alkylphenol compounds each having 1 to 10 carbon atoms, preferably 1 to 4 carbon atoms in the alkyl moiety, such as p-isopropylphenol, p-tert-butylphenol, p-tert-aminophenol, and p-tert-octylphenol.

The condensation reaction between these compounds and the carbonyl compound such as formaldehyde or acetone can be carried out by a known method in itself. In general, condensation in the presence of an alkali catalyst provides a resole type resin which becomes insoluble and infusible with the progress of condensation, and condensation in the presence of an acid catalyst provides a soluble and fusible novolac type resin.

In the present invention, the latter novolac type phenol resin can usually be used. Although the molecular weight of the novolac type phenol resin increases with the progress of condensation, in usual, a novolac type phenol resin having a molecular weight of 500 to 2,000 obtained by carrying out condensation for 1 to 3 hours is preferably used. As another monomer copolymerizable with the hydroxyl group-containing vinyl aromatic compound, another copolymerizable monomer which is the same as that mentioned for the copolymer as the polymer (a) can be used.

In usual, the hydroxyphenyl group-containing polymer (b) preferably has a number-average molecular weight in a range of about 500 to 1,000,000, particularly about 1,000 to 30,000. A preferred range of the hydroxyphenyl group content of the polymer (b) is usually 1.0 to 10 equivalents, particularly 2.0 to 8.0 equivalents per kg of polymer. If the hydroxyphenyl group content is less than 1.0 equivalent/kg, the degree of cross-linking of a film formed by heating before irradiation with activation rays tends to be insufficient. On the other hand, if the hydroxyphenyl group content exceeds 10 equivalents/kg, an obtained resist film tends to be brittle.

The polymer (b) preferably has a glass transition temperature (Tg) of 0° C. or higher, particularly in a range of 5 to 70° C., similarly to the polymer (a). If the Tg is less than 0° C., an obtained coating film has tackiness and therefore dust and dirt easily adhere to the film so that the handling of the film tends to be difficult.

Carboxyl Group and Hydroxyphenyl Group-Containing Polymer (c):

A polymer (c) is a film-formable polymer containing at least one carboxyl group and hydroxyphenyl group in one molecule. Examples of such a polymer (c) include: a copolymer of hydroxystyrene such as p-hydroxystyrene and a carboxyl group-containing polymerizable unsaturated monomer; and a copolymer of the hydroxystyrene, the carboxyl group-containing monomer and another copolymerizable monomer.

Examples of the carboxyl group-containing polymerizable unsaturated monomer include acrylic acid, methacrylic acid, crotonic acid, itaconic acid and the like. Examples of another copolymerizable monomer include: $C_1$ to $C_{12}$ alkyl esters of (meth)acrylic acid, such as methyl (meth)acrylate, ethyl (meth)acrylate, propyl (meth)acrylate, butyl (meth)acrylate, hexyl (meth)acrylate, octyl (meth)acrylate, 2-ethylhexyl (meth)acrylate, nonyl (meth)acrylate, and decyl (meth)acrylate; $C_2$ to $C_6$ hydroxyalkyl esters of (meth)acrylic acid, such as hydroxyethyl (meth)acrylate, 2-hydroxypropyl (meth)acrylate, 3-hydroxypropyl (meth)acrylate, and hydroxybutyl (meth)acrylate; vinyl aromatic compounds such as styrene, α-methylstyrene, and p-tert-butylstyrene; vinyl acetate; (meth)acrylonitrile; (meth)acrylamide; and vinylpyrrolidone. These monomers can be used singly or in combination of two or more. Further, as the polymer (c), phenol carboxylic acids such as hydroxybenzoic acid, gallic acid, and resorcylic acid; and a polymer obtained by condensation of formaldehyde with a mixture of the phenol carboxylic acids with one or two or more of phenols selected from phenol, $C_1$ to $C_{18}$ mono- or dialkyl-substituted phenol or naphthols, resorcinol, and catechol can be used.

In usual, the polymer (c) preferably has a number-average molecular weight in a range of about 500 to 100,000, particularly about 1,500 to 30,000. A preferred range of the carboxyl group content of the polymer (c) is usually 0.5 to 10 equivalents, particularly 0.5 to 5.0 equivalents per kg of polymer, and a preferred range of the hydroxyphenyl group content of the polymer (c) is at least 1.0 equivalent, particularly 2.0 to 8.0 equivalents per kg of polymer. If the carboxyl group content is less than 0.5 equivalent/kg, the degree of cross-linking of a film formed by heating before irradiation with activation rays is not sufficient, and developability tends to lower due to decreased solubility of the exposed portions in an alkaline developer. On the other hand, if the carboxyl group content exceeds 10 equivalents/kg, the storage stability of the composition tends to lower. If the hydroxyphenyl group content is less than 1.0 equivalent/kg, there is case that the degree of cross-linking at cross-linking is not sufficient.

Further, the polymer (c) preferably has a glass transition temperature (Tg) of 0° C. or higher, particularly in a range of 5 to 70° C. If the Tg is less than 0° C., an obtained coating film has tackiness and therefore dust and dirt easily adhere to the film so that the handling of the film tends to be difficult.

Photo-Acid Generator Compound (C):

A compound (C) generates an acid when irradiated with activation energy rays. Specifically, the compound (hereinafter also referred to as a "photo-acid generating compound") is decomposed by irradiation with activation energy rays which will be described below and generates an acid having an intensity sufficient to cleave the cross-linked structure formed between the polymer (B) and the compound (A). As such a compound, conventionally known compounds can be used.

Examples of compounds and mixtures thereof to be used as the photo-acid generator include: diazonium, phosphonium, sulfonium, and iodonium salts; halogen compounds; combinations of organic metal and organohalogen; benzoin and o-nitrobenzyl esters of a strong acid such as toluene sulfonic acid; and N-hydroxyamide and N-hydroxyimide sulfonates as described in U.S. Pat. No. 4,371,605, and also include allylnaphthoquinone-diazide-4-sulfonates. A preferable photo-solubilizing agent is diaryliodonium or triarylsulfonium salts. In general, these compounds present in the form of the salts of complex metal halide ions, such as tetrafluoropoloate, hexafluoroantimonate, hexafluoroarsenate, and hexafluorophosphate. Other effective groups of acid generators exhibiting photosensitivity include oligomers and polymers, to which an anionic group having an aromatic onium acid generator as positive pair ions is added. Examples of such polymers include polymers described at column 9, lines 1 to 68, and column 10, lines 1 to 14 in U.S.

Pat. No. 4,661,429, the teaching of which are hereby incorporated by reference. For the purpose of controlling a spectrum sensitivity to an applicable wavelength of actinic rays, a sensitizer is preferably added to the system. Necessity of addition of a sensitizer depends on requirements of the system and a specific photosensitive compound to be used. For example, in the case of iodonium and sulfonium salts which respond to only a wavelength less than 300 nm, use of benzophenone and derivatives thereof, polycyclic aromatic hydrocarbons such as perylene, pyrene and anthracene, and derivatives thereof makes it possible to be photosensitive to a longer wavelength. The decomposition of diaryliodonium and triarylsulfonium salts is also made photosensitive by the use of bis-(p-N,N-dimethylaminobenzylidene)-acetone. A sulfonium salt bonded to anthracene via a chain comprising 3 to 4 atoms is an effective photosolubilizing agent. Compounds described in MG. Tilley's dissertation for a Ph.D, North Dakota State University, Fargo, N. Dak. (1988) "Diss. Abstr. Int. B, 49, 8791 (1989): Chem. Abstr., 111, 39942u" are preferable type photosolubilizing agents. As another preferable acid generator, ATASS, that is, 3-(9-anthracenyl)propyl-diphenylsulfonium-hexafluoroantimonate can be mentioned.

In this compound, anthracene and a sulfonium salt are bonded via a chain comprising 3 carbons. Additional examples of acid generators to herein be used include diphenyliodonium tosylate, benzoin tosylate, and triarylsulfonium hexafluoroantimonate. As acid generators other than the acid generators mentioned above, iron-arene complexes, ruthenium-arene complexes, silanol-metal chelate complexes, triazine compounds, diazidonaphthoquinone compounds, sulfonates, imidosulfonates, and halogen-based compounds can also be used, for example. In addition, acid generators described in Japanese Patent Laid-open No. Hei 7-146552 and Japanese Patent Application No. Hei 9-289218 can also be used. The mixing ratio of the acid generator is preferably in a range of about 0.1 to 40 parts by weight, particularly about 0.2 to 20 parts by weight with respect to 100 parts by weight of the total of the compound (A) and the resin (B). As a positive resin composition for activation energy rays to be used for a dry film of the present invention, an organic solvent-based resin composition obtained by dispersing or dissolving the above-described components (in a case where a pigment is used as a colorant, the pigment is finely dispersed) in an organic solvent can be used.

The composition of the present invention contains three components, the vinyl ether group-containing compound (A), the polymer (B), and as necessary, the photo-acid generating compound (C). Although the mixing ratio among them may vary within a wide range depending on applications of the composition, a preferred amount of the vinyl ether group-containing compound (A) to be used is usually in a range of 5 to 150 parts by weight, particularly in a range of 10 to 100 parts by weight with respect to 100 parts by weight of the polymer (B), and a preferred amount of the photo-acid generating compound to be used is usually in a range of 0 to 40 parts by weight, particularly in a range of 0.2 to 20 parts by weight with respect to 100 parts by weight of the total amount of the polymer (B) and the vinyl ether group-containing compound (A).

The composition of the present invention may contain a sensitizing dye, as necessary. Examples of a usable sensitizing dye include dyes such as phenothiazine type, anthracene type, coronene type, benzanthracene type, perylene type, pyrene type, merocyanine type, and ketocoumarin type.

A range of the amount of the sensitizing dye to be mixed is 0.1 to 10 parts by weight, preferably 0.3 to 5 parts by weight with respect to 100 parts by weight of the polymer (B).

The composition of the present invention may contain a colorant, as necessary. As a usable colorant, a combination of a leuco dye and a halogen compound is well known. Examples of a leuco dye include tris(4-dimethylamino-2-methylphenyl)methane "leuco crystal violet" and tris(4-dimethylamino-2-methylphenyl)methane "leuco malachite green". On the other hand, examples of a halogen compound include amyl bromide, isoamyl bromide, isobutylene bromide, ethylene bromide, diphenylmethyl bromide, benzayl bromide, methylene bromide, tribromomethylphenylsulfone, carbon tetrabromide, tris(2,3-dibromopropyl)phosphate, trichloroacetamide, amyl iodide, isobutyl iodide, 1,1,1-trichloro-2,2-bis(p-chlorophenyl)ethane, and hexachloroethane. The composition may contain a colorant other than the colorants mentioned above.

For the purpose of imparting appropriate flexibility and non-tackiness to the formed film, the composition of the present invention may contain a plasticizer such as phthalate ester; a polyester resin; or an acrylic resin. In usual, the content of them is preferably 50 parts by weight or less with respect to 100 parts by weight of the total amount of the polymer (B) and the vinyl ether group-containing compound (A).

Further, the composition of the present invention may contain a fluidity-controlling agent, as necessary.

The composition of the present invention can be prepared by mixing the above-mentioned components as they are, or mixing them in a solvent, as necessary. A usable solvent is not particularly limited as long as it can dissolve the components of the composition. Examples of such a solvent include: ketones such as acetone, methyl ethyl ketone, methyl isobutyl ketone, cyclohexanone, and isophorone; esters such as methyl acetate, ethyl acetate, and butyl acetate; $C_1$ to $C_{10}$ aliphatic alcohols such as methanol, ethanol, and propanol; aromatic group containing-alcohols such as benzyl alcohol; glycols such as ethylene glycol and propylene glycol; glycol ethers such as mono- or diethers of these glycols with methanol, ethanol, butanol, hexanol, octanol, benzyl alcohol, or phenol, or esters of the monoethers; cyclic ethers such as dioxane and tetrahydrofuran; cyclic carbonates such as ethylene carbonate and propylene carbonate; and aliphatic or aromatic hydrocarbons. These solvents can be used singly or in combination of two or more, as necessary.

It is to be noted that the present invention has a feature that an atom at the bonding site of the vinyl ether group of the vinyl ether group-containing compound is a secondary or tertiary carbon atom. As a result, it is believed that the cross-linked structure formed by an addition reaction between a carboxyl group or a hydroxyphenyl group and a vinyl ether group is easily cleaved by an acid generated by irradiation with light or exposure by carrying out a heat treatment at a temperature less than 60° C. or carrying out no heat treatment, thereby enabling a resist pattern having an excellent sensitivity and resolution to be formed.

Next, a method of forming a pattern of the present invention will be described.

Pattern Formation Method 1:

One embodiment of a pattern formation method of the present invention comprises the steps of: applying the composition for activation energy rays onto a substrate; heating the substrate; irradiating the substrate with activation energy rays for patterning; carrying out no heat treatment or carrying out a heat treatment at a temperature less than 60° C.

after irradiation; and developing the substrate with a basic developer. By carrying out these steps in order, a desired resist pattern can be formed.

Pattern Formation Method 2:

Another embodiment of the pattern formation method of the present invention comprises the steps of: applying the composition for activation energy rays onto a transparent support film capable of transmitting activation energy rays and drying it to form a film layer of the composition for activation energy rays, obtaining a dry film resist for activation energy rays; press-bonding the film layer for activation energy rays of the dry film resist onto a substrate on which a pattern is to be formed; heating the substrate; irradiating the film layer with activation energy rays through the support film for patterning; carrying out a heat treatment at a temperature less than 60° C. or carrying out no heat treatment after irradiation; and removing the support film and developing the substrate with a basic developer. By carrying out these steps in order, a desired resist pattern can be formed.

Pattern Formation Method 3:

Still another embodiment of the pattern formation method of the present invention comprises the steps of: applying the composition for activation energy rays onto a transfer film and drying it to form a film layer of the composition for activation energy rays, obtaining a transfer film resist; press-bonding the film layer of the composition for activation energy rays of the transfer film resist onto a substrate on which a pattern is to be formed; heating the substrate; removing the transfer film; irradiating the film layer with activation energy rays for patterning; carrying out a heat treatment at a temperature less than 60° C. or carrying out no heat treatment after irradiation; and developing the substrate with a basic developer. By carrying out these steps in order, a desired resist pattern can be formed.

Articles and methods to be used in these steps in the pattern formation methods 1 to 3 will be described below.

As a substrate onto which the composition for activation energy rays is to be applied, or the dry film resist or the transfer film resist is to be press-bonded, a copper-clad laminate can be used, for example.

The composition for activation energy rays can be applied onto a substrate or a support film which will be described later by means such as a roller, a roll coater, a spin coater, a curtain-roll coater, spraying, electrostatic coating, dip coating, silk printing, or spin coating.

The substrate or the support film onto which the composition for activation energy rays has been applied is heated in a hot air drier at 60 to 150° C. for 5 minutes to 1 hour, preferably at 80 to 120° C. for 10 to 30 minutes, thereby forming a coating film.

A light source for irradiation with activation energy rays to form a pattern may be a light within a visible region obtained by cutting ultraviolet rays through a UV-cutting filter from a light obtained from a conventionally used light source such as an ultra-high, high, moderate, or low pressure mercury lamp, a chemical lamp, a carbon arc lamp, a xenon lamp, a metal halide lamp, a fluorescent lamp, a tungsten lamp, or solar light, or various lasers having an oscillation line within a visible region. As a high power and stable laser beam source, an argon laser or the second harmonic of a YAG laser (532 nm) is preferable.

In the liquid developing treatment, for example, spraying or dipping may be carried out using a developer having a temperature of about 10 to 80° C., preferably about 15 to 50° C. for about 10 seconds to 60 minutes, preferably about 30 seconds to 30 minutes, thereby enabling a pattern to be formed on the film layer of the composition for activation energy rays.

Examples of the liquid developer include an aqueous solution of monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, ammonia, sodium hydroxide, potassium hydroxide, sodium metasilicate, potassium metasilicate, sodium carbonate, or tetraethylammonium hydroxide.

As a transparent support film capable of transmitting activation energy rays, which is to be used for the dry film resist in the pattern formation method (2) of the present invention, polyethylene terephthalate can be used.

The film layer for activation energy rays of the dry film resist can be press-bonded onto a substrate, on which a resist pattern is to be formed, while applying pressure at a temperature of 30 to 120° C., for example.

As a transfer film to be used for the transfer film resist in the pattern formation method (3) of the present invention, polyethylene terephthalate can be used, for example.

The film layer of the composition for activation energy rays of the transfer film resist can be press-bonded onto a substrate while applying pressure at a temperature of 30 to 120° C., for example.

In the pattern formation methods (2) and (3), the resist film press-bonding step and the substrate heating step may be carried out separately, or they may be carried out simultaneously at press-bonding, as described above.

The composition of the present invention can be used for various purposes such as paint, ink, adhesives, resist materials, printing plate materials (materials for surface printing plates or relief printing plates, or PS plates for offset printing), information recording materials, and materials for forming relief images, similarly to known photosensitive materials.

The method of the present invention can be applied to any purpose without limitation as long as the method comprises the above-mentioned steps.

Examples of the purposes organized by industrial fields include: electrical fields such as electrical parts, lightings, electrical devices, semiconductors, printings, printed circuits, electronic communications, and electric powers; physical fields such as measurement field, optical field, display field, acoustic field, control field, vending field, signals, and information recording field; chemistry/metallurgy/fiber fields such as inorganic chemistry, organic chemistry, polymer chemistry, metallurgy, and fiber; treatment/transportation fields such as separation or mixing, metal processing, plastic processing, printings, containers, and packing; articles for living such as agricultural and marine fields, foods, fermentation, household articles, health and recreation fields; and mechanical engineering.

Examples of the electrical fields include a black matrix insulating film formation method, an insulating film formation method by build up method, a solder resist insulating film formation method, a display panel barrier formation method, a formation method of a black belt for a display panel, a formation method of a colored insulating film for a color filter, a display panel fluorescent material, a hologram pattern, CD mastering, and coil; examples of the physical fields include optical fiber fabricating, floppy disk, magnetic tape, magnetic card, optical parts, and electric wave absorber; examples of chemistry/metallurgy/fiber fields include inorganic glass, cement, and ceramic insulators;

examples of treatment/transportation fields include printed matter, printing original plate, diffraction grating, marking, bar code, mask, filter, etching, defroster, cement processing, stone processing, fiber processing, plastic processing, and label; examples of articles for living include carrier, cosmetic, and fermentation industry; and examples of mechanical engineering include micromachine parts.

The present invention is not limited to the following examples. In the following description, "part" and "%" are "part by weight" and "% by weight", respectively.

Synthesis Example 1

Synthesis of a carboxyl group-containing polymer (1)

A mixture containing 7.8 parts of acrylic acid, 50 parts of methyl methacrylate, 12.2 parts of ethyl acrylate, 30 parts of phenoxyethylene glycol acrylate, and 1 part of tert-butylperoxy-2-ethylhexanoate as a polymerization initiator was polymerized to obtain a carboxyl group-containing polymer. The obtained carboxyl group-containing polymer had a number-average molecular weight of 4,500, a carboxyl group content of 1 equivalent/kg of polymer, and a glass transition temperature of 0° C. or higher.

Synthesis Example 2

Synthesis of Hydroxyphenyl Group-Containing Polymer (2)

1,490 parts of o-cresol, 1,145 parts of a 30% aqueous formaldehyde solution, 130 parts of deionized water, and 6.5 parts of oxalic acid were placed into a flask, and the mixture was refluxed for 60 minutes. 13.5 parts of 15% hydrochloric acid was added thereto, and the resulting mixture was refluxed for 40 minutes. 400 parts of deionized water having a temperature of about 15° C. was added thereto, and the contents in the flask were kept at about 75° C. to precipitate a resin. A 35% sodium hydroxide solution was added thereto for neutralization, and then an aqueous layer was removed. The same washing operation was repeated twice, and then the resin was dried at about 120° C. under reduced pressure to obtain a novolac phenol resin. The obtained novolac phenol resin (hydroxyphenyl group-containing polymer) had a number-average molecular weight of 600, a hydroxyphenyl group content of 10 equivalents/kg of polymer, and a glass transition temperature of 0° C. or higher.

Synthesis Example 3

Synthesis of Carboxyl Group and Hydroxyphenyl Group-Containing Polymer (3)

600 parts of o-hydroxybenzoic acid, 900 parts of o-cresol, 1,145 parts of a 30% aqueous formaldehyde solution, 130 parts of deionized water, and 6.5 parts of oxalic acid were placed into a flask, and the mixture was refluxed for 60 minutes. 13.5 parts of 15% hydrochloric acid was added thereto, and the resulting mixture was refluxed for 40 minutes. 400 parts of deionized water having a temperature of about 15° C. was added thereto, and the contents in the flask were kept at about 50° C. to precipitate a resin. 400 parts of deionized water was added thereto to wash the resin at 50° C., and an aqueous layer was then removed. The same washing operation was repeated three times, and the resin was dried at about 120° C. under reduced pressure to obtain a novolac phenol resin (3). The obtained novolac phenol resin had a number-average molecular weight of about 650, a carboxyl group content of 2.8 mols/kg of polymer, a hydroxyphenyl group content of 5.4 mols/kg of polymer, and a glass transition temperature of 0° C. or higher.

Example 1

A mixture containing a resin obtained by adding 100 parts of the polymer (1) as the polymer (B) to 14 parts of cyclohexyl vinyl ether as the vinyl ether group-containing compound (A), and 2 parts of a photo-acid generator (available from DAICEL UCB CO LTD under the name of "UVAC1591", and hereinafter this product was used as a photo-acid generator) was dissolved in cyclohexanone to prepare a 30 wt % composition solution.

Example 2

A 30 wt % composition solution was prepared in the same manner as Example 1 except that the polymer (2) was used as the polymer (B).

Example 3

A 30 wt % composition solution was prepared in the same manner as Example 1 except that the polymer (3) was used as the polymer (B).

Comparative Example 1

A 30 wt % composition solution was prepared in the same manner as Example 1 except that methyl vinyl ether was used as the vinyl ether group-containing compound (A).

Example 4

A mixture containing 100 parts of the polymer (1) as the polymer (B), 53 mmol of a compound represented by the following formula as the vinyl ether group-containing compound (A) with respect to 100 g of the polymer (1), and 2 parts of the photo-acid generator was dissolved in cyclohexanone, to prepare a 30 wt % composition solution:

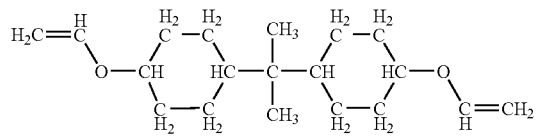

Example 5

A 30 wt % composition solution was prepared in the same manner as Example 4 except that the polymer (2) was used as the polymer (B).

Example 6

A 30 wt % composition solution was prepared in the same manner as Example 4 except that the polymer (3) was used as the polymer (B).

Example 7

A mixture containing 100 parts of the polymer (1) as the polymer (B), 53 mmol of a compound represented by the following formula as the vinyl ether group-containing compound (A) with respect to 100 g of the polymer (1), and 2 parts of the photo-acid generator was dissolved in cyclohexanone, to prepare a 30 wt % composition solution:

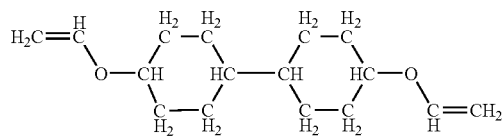

Example 8

A 30 wt % composition solution was prepared in the same manner as Example 7 except that the polymer (2) was used as the polymer (B).

Example 9

A 30 wt % composition solution was prepared in the same manner as Example 7 except that the polymer (3) was used as the polymer (B).

Comparative Example 2

A 30 wt % composition solution was prepared in the same manner as Example 4 except that a compound represented by the following formula was used as the vinyl ether group-containing compound (A):

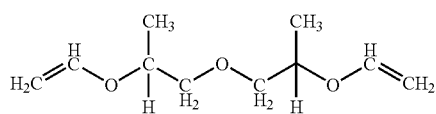

Comparative Example 3

A 30 wt % composition solution was prepared in the same manner as Example 4 except that a compound represented by the following formula described in Example 1 of Japanese Patent Laid-open No. Hei 6-295064 was used as the vinyl ether group-containing compound (A):

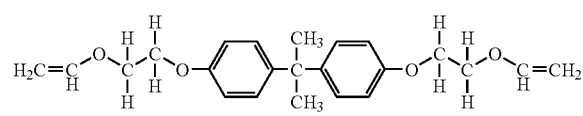

Performance Evaluation Test 1:

A resist film was formed using the composition solution of each of Examples and Comparative Examples and its performance was evaluated as follows. The resist film was formed by applying the solution obtained in each of Examples and Comparative Examples onto a copper-clad substrate to have a dry film thickness of 10 μm by the use of a bar coater, and drying the applied solution at 100° C. for 10 minutes to carry out an addition reaction of a carboxyl group or a hydroxyphenyl group with a vinyl ether group.

(1) Drying Properties after Pre-Drying Evaluated by Touching with a Finger

After drying the applied composition solution of each of Examples and Comparative Examples, the drying properties of the coating film surface were determined by touching with the finger and evaluated according to the following criteria.

O: Tackiness was not observed at all.

Δ: Tackiness was slightly observed.

X: Tackiness was considerably observed.

(2) Sensitivity

After drying the applied composition solution of each of Examples and Comparative Examples, the obtained resist film was irradiated with ultraviolet rays of 365 nm through a 21-step step tablet (manufactured by HITACHI), and was then allowed to stand at room temperature for 10 minutes. Then, the resist film was developed using an aqueous 0.75% sodium carbonate solution having a temperature of 25° C., to prepare a test substrate. For Examples 1 to 3 and Comparative Example 1, irradiation was carried out at an ultraviolet rays intensity of 300 mJ/cm$^2$, 500 mJ/cm$^2$, and 1,000 mJ/cm$^2$, and for Examples 4 to 9 and Comparative Examples 2 and 3, irradiation was carried out at an ultraviolet rays intensity of 100 mJ/cm$^2$, 300 mJ/cm$^2$, and 1,000 mJ/cm$^2$. Sensitivity was evaluated according to the number of steps of the step tablet that a pattern could be formed.

(3) Resistance to Etching

Each of the test substrates prepared in the same manner described above was subjected to etching using a cupric chloride etching solution, and the test substrate was visually checked as to whether or not the coating film was stripped. Evaluation was carried out according to the following criteria.

O: Stripping was not observed at all.

Δ: Stripping was slightly observed.

X: Stripping was considerably observed.

(4) Separation Properties

Each of the test substrates prepared in the same manner described above was dipped in a 3% aqueous sodium hydroxide solution at 50° C., and then the test substrate was visually observed to check the removability and separation properties of the coating film. Evaluation was carried out according to the following criteria.

O: No resist residues were observed.

Δ: Resist residues were slightly observed.

X: Resist residues remained all over the surface of the substrate.

The results of the above tests are shown in Table 1. As is apparent from Table 1, the coating film formed from the compound for activation energy rays of the present invention has excellent sensitivity, high resistance to etching, and an excellent separation properties.

TABLE 1

| | Drying properties evaluated by touching with finger | Sensitivity (mJ/cm²) | | | | Resistance to etching | Separation properties |
|---|---|---|---|---|---|---|---|
| | | 100 | 300 | 500 | 1,000 | | |
| Ex. 1 | ○ | — | 7 steps | 10 steps | 14 steps | ○ | ○ |
| Ex. 2 | ○ | — | 5 steps | 8 steps | 12 steps | ○ | ○ |
| Ex. 3 | ○ | — | 6 steps | 9 steps | 13 steps | ○ | ○ |
| Comp. Ex. 1 | ○ | — | Exposed portions were insoluble | Exposed portions were insoluble | Exposed portions were insoluble | ○ | ○ |
| Ex. 4 | ○ | 7 steps | 10 steps | — | 14 steps | ○ | ○ |
| Ex. 5 | ○ | 5 steps | 8 steps | — | 12 steps | ○ | ○ |
| Ex. 6 | ○ | 6 steps | 9 steps | — | 13 steps | ○ | ○ |
| Ex. 7 | ○ | 7 steps | 10 steps | — | 14 steps | ○ | ○ |
| Ex. 8 | ○ | 5 steps | 8 steps | — | 12 steps | ○ | ○ |
| Ex. 9 | ○ | 6 steps | 9 steps | — | 13 steps | ○ | ○ |
| Comp. Ex. 2 | ○ | Exposed portions were insoluble | Exposed portions were insoluble | — | Exposed portions were insoluble | ○ | ○ |
| Comp. Ex. 3 | ○ | Exposed portions were insoluble | Exposed portions were insoluble | — | Exposed portions were insoluble | ○ | ○ |

Example 10

The composition solution obtained in Example 1 was applied onto a non-treated polyethylene terephthalate support film with a thickness of 38 μm to have a dry film thickness of 10 μm by the use of a roll coater, and was dried at 120° C. for 10 minutes. Then, a non-treated polypropylene film having a thickness of 20 μm was attached to the coating film surface to prepare a dry film resist.

After the polypropylene film was removed, the coating film surface of the dry film resist was press-bonded onto a substrate obtained by laminating a copper film with a thickness of 18 μm onto a polyimide film with a thickness of 100 μm, by the use of a laminator with a roll temperature of 100° C.

The obtained substrate was exposed in the same manner as Performance evaluation test 1, and was then allowed to stand at room temperature for 10 minutes. After the support film was removed, evaluation was carried out in the same manner as Performance evaluation test 1. The results are shown in Table 2.

Example 11

The composition solution obtained in Example 1 was applied onto a non-treated polyethylene terephthalate transfer film with a thickness of 38 μm to have a dry film thickness of 10 μm by the use of a roll coater, and was dried at 120° C. for 10 minutes, to prepare a transfer film resist.

The transfer film resist was press-bonded onto a substrate obtained by laminating a copper film with a thickness of 18 μm onto a polyimide film with a thickness of 100 μm, by the use of a laminator with a roll temperature of 100° C.

After the transfer film was removed, the substrate was exposed in the same manner as Performance evaluation test 1, and was then allowed to stand at room temperature for 10 minutes. Thereafter, evaluation was carried out in the same manner as Performance evaluation test 1. The results are shown in Table 2.

Example 12

A dry film resist was prepared and evaluated in the same manner as Example 10 except that the composition solution obtained in Example 4 was used. The results are shown in Table 2.

Example 13

A transfer film type resist was prepared and evaluated in the same manner as Example 11 except that the composition solution obtained in Example 4 was used. The results are shown in Table 2.

Example 14

A dry film resist was prepared and evaluated in the same manner as Example 10 except that the composition solution obtained in Example 7 was used. The results are shown in Table 2.

Example 15

A transfer film type resist was prepared and evaluated in the same manner as Example 11 except that the composition solution obtained in Example 7 was used. The results are shown in Table 2.

TABLE 2

| | Drying properties evaluated by touching with finger | Sensitivity (mJ/cm²) | | | | Resistance to etching | Separation properties |
|---|---|---|---|---|---|---|---|
| | | 100 | 300 | 500 | 1,000 | | |
| Ex. 10 | ○ | — | 7 steps | 10 steps | 14 steps | ○ | ○ |
| Ex. 11 | ○ | — | 7 steps | 10 steps | 14 steps | ○ | ○ |
| Ex. 12 | ○ | 5 steps | 8 steps | — | 12 steps | ○ | ○ |
| Ex. 13 | ○ | 7 steps | 10 steps | — | 14 steps | ○ | ○ |
| Ex. 14 | ○ | 5 steps | 8 steps | — | 12 steps | ○ | ○ |
| Ex. 15 | ○ | 7 steps | 10 steps | — | 14 steps | ○ | ○ |

INDUSTRIAL APPLICABILITY

As described above, according to the present invention, it is possible to provide a chemically amplified positive resist having an excellent sensitivity and resolution even in conditions that heating at a temperature less than 60° C. is carried out or heating is not carried out after exposure, thereby enhancing production speed and improving the reliability of the resist. Since heating after exposure is not necessary or carried out at a low temperature, thermal history to a substrate can be controlled, reducing thermal effects on the substrate. In addition, a capital investment and an energy cost associated with heating after exposure can be reduced.

The invention claimed is:

1. A composition for activation energy rays comprising, as essential components, a vinyl ether group-containing compound (A) represented by the following formula:

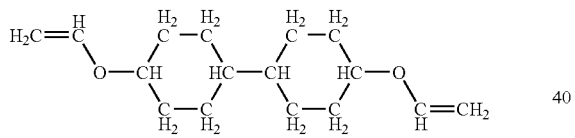

and at least one polymer (B) selected from the group consisting of the following polymers (a) to (c);

(a) a polymer containing 0.5 to 10 equivalents of a carboxyl group per kg of the polymer, and having a number-average molecular weight in a range of 3,000 to 100,000 and a glass transition temperature of 0° C. or higher, (b) a polymer containing at least 1 to 10 equivalents of a hydroxyphenyl group per kg of the polymer, and having a number-average molecular weight in a range of 500 to 100,000 and a glass transition temperature of 0° C. or higher, and (c) a polymer containing at least 0.2 to 20 equivalents of a hydroxyphenyl group and a carboxyl group per kg of polymer, and having a number-average molecular weight in a range of 500 to 100,000 and a glass transition temperature of 0° C. or higher.

* * * * *